US006636440B2

(12) United States Patent
Maayan et al.

(10) Patent No.: US 6,636,440 B2
(45) Date of Patent: Oct. 21, 2003

(54) METHOD FOR OPERATION OF AN EEPROM ARRAY, INCLUDING REFRESH THEREOF

(75) Inventors: Eduardo Maayan, Kfar Saba (IL); Ron Eliyahu, Herzelia (IL); Shai Eisen, Tel Aviv (IL); Boaz Eitan, Ra'anana (IL)

(73) Assignee: Saifun Semiconductors Ltd., Netanya (IL)

( * ) Notice: Subject to any disclaimer, the term of this patent is extended or adjusted under 35 U.S.C. 154(b) by 0 days.

(21) Appl. No.: 09/841,052

(22) Filed: Apr. 25, 2001

(65) Prior Publication Data

US 2002/0191465 A1 Dec. 19, 2002

(51) Int. Cl.[7] .......................... G11C 16/04; G11C 16/06
(52) U.S. Cl. ..................... 365/185.25; 365/185.02; 365/185.24
(58) Field of Search ................. 365/185.02, 185.03, 365/185.24, 185.25

(56) References Cited

U.S. PATENT DOCUMENTS

| 3,895,360 A | 7/1975 | Cricchi et al. |
| 4,016,588 A | 4/1977 | Ohya et al. |
| 4,017,888 A | 4/1977 | Christie et al. |
| 4,151,021 A | 4/1979 | McElroy |
| 4,173,766 A | 11/1979 | Hayes |
| 4,173,791 A | 11/1979 | Bell |
| 4,281,397 A | 7/1981 | Neal et al. |
| 4,306,353 A | 12/1981 | Jacobs et al. |
| 4,342,149 A | 8/1982 | Jacobs et al. |
| 4,360,900 A | 11/1982 | Bate |
| 4,380,057 A | 4/1983 | Kotecha et al. |
| 4,388,705 A | 6/1983 | Sheppard |
| 4,389,705 A | 6/1983 | Sheppard |
| 4,471,373 A | 9/1984 | Shimizu et al. |
| 4,527,257 A | 7/1985 | Cricchi |
| 4,586,163 A | 4/1986 | Koike |
| 4,630,085 A | 12/1986 | Koyama |
| 4,667,217 A | 5/1987 | Janning |
| 4,780,424 A | 10/1988 | Holler et al. |
| 4,847,808 A | 7/1989 | Kobatake |

(List continued on next page.)

FOREIGN PATENT DOCUMENTS

| EP | 0693781 | 7/1994 |
| EP | 0751560 | 6/1995 |
| EP | 1073120 | 7/2000 |
| GB | 2157489 | 3/1984 |
| JP | 04291962 | 3/1991 |
| JP | 05021758 | 7/1991 |
| JP | 04226071 | 8/1992 |
| JP | 07193151 | 12/1993 |
| JP | 09162314 | 12/1995 |
| JP | 11 162182 | 9/1999 |
| WO | WO 96/15553 | 11/1994 |
| WO | WO 99/31670 | 12/1997 |

OTHER PUBLICATIONS

U.S. patent application Ser. No. 08/902,890, Eitan, filed Jul. 30, 1997.
U.S. patent application Ser. No. 08/905,286, Eitan, filed Aug. 1, 1997.

(List continued on next page.)

*Primary Examiner*—Son Mai
(74) *Attorney, Agent, or Firm*—Eitan, Pearl, Latzer & Cohen Zedek, LLP.

(57) ABSTRACT

A method for operating an electrically erasable programmable read only memory (EEPROM) array, the method including refreshing a threshold voltage of a bit of a memory cell in an EEPROM array, the threshold voltage being different than a previous threshold voltage, by restoring the threshold voltage of the bit at least partially back to the previous threshold voltage.

36 Claims, 3 Drawing Sheets

U.S. PATENT DOCUMENTS

| | | |
|---|---|---|
| 4,870,470 A | 9/1989 | Bass, Jr. et al. |
| 4,916,671 A | 4/1990 | Ichiguchi |
| 4,941,028 A | 7/1990 | Chen et al. |
| 5,021,999 A | 6/1991 | Kohda et al. |
| 5,075,245 A | 12/1991 | Woo et al. |
| 5,117,389 A | 5/1992 | Yiu |
| 5,168,334 A | 12/1992 | Mitchell et al. |
| 5,172,338 A | 12/1992 | Mehrotra et al. |
| 5,175,120 A | 12/1992 | Lee |
| 5,204,835 A | 4/1993 | Eitan |
| 5,214,303 A | 5/1993 | Aoki |
| 5,241,497 A | 8/1993 | Komarek |
| 5,260,593 A | 11/1993 | Lee |
| 5,268,861 A | 12/1993 | Hotta |
| 5,289,412 A | 2/1994 | Frary et al. |
| 5,293,563 A | 3/1994 | Ohta |
| 5,305,262 A | 4/1994 | Yoneda |
| 5,311,049 A | 5/1994 | Tsuruta |
| 5,315,541 A | 5/1994 | Harari et al. |
| 5,345,425 A | 9/1994 | Shikatani |
| 5,349,221 A | 9/1994 | Shimoji |
| 5,350,710 A | 9/1994 | Hong et al. |
| 5,359,554 A | 10/1994 | Odake et al. |
| 5,375,094 A * | 12/1994 | Naruke ...................... 365/222 |
| 5,393,701 A | 2/1995 | Ko et al. |
| 5,394,355 A | 2/1995 | Uramoto et al. |
| 5,399,891 A | 3/1995 | Yui et al. |
| 5,412,601 A | 5/1995 | Sawada et al. |
| 5,414,693 A | 5/1995 | Ma et al. |
| 5,418,176 A | 5/1995 | Yang et al. |
| 5,418,743 A | 5/1995 | Tomioka et al. |
| 5,422,844 A | 6/1995 | Wolstenholme et al. |
| 5,424,978 A | 6/1995 | Wada et al. |
| 5,426,605 A | 6/1995 | Van Berkel et al. |
| 5,434,825 A | 7/1995 | Harari |
| 5,450,341 A | 9/1995 | Sawada et al. |
| 5,450,354 A | 9/1995 | Sawada et al. |
| 5,467,308 A | 11/1995 | Chang et al. |
| 5,477,499 A | 12/1995 | Van Buskirk et al. |
| 5,495,440 A | 2/1996 | Asakura |
| 5,496,753 A | 3/1996 | Sakurai et al. |
| 5,521,870 A | 5/1996 | Ishikawa |
| 5,523,251 A | 6/1996 | Hong |
| 5,553,018 A | 9/1996 | Wang et al. |
| 5,583,808 A | 12/1996 | Brahmbhatt |
| 5,599,727 A | 2/1997 | Hakozaki et al. |
| 5,623,438 A | 4/1997 | Guritz et al. |
| 5,654,568 A | 8/1997 | Nakao |
| 5,656,513 A | 8/1997 | Wang et al. |
| 5,661,060 A | 8/1997 | Gill et al. |
| 5,683,925 A | 11/1997 | Irani et al. |
| 5,712,814 A | 1/1998 | Fratin et al. |
| 5,715,193 A * | 2/1998 | Norman .................. 365/185.02 |
| 5,726,946 A | 3/1998 | Yamagata et al. |
| 5,751,037 A | 5/1998 | Aozasa et al. |
| 5,754,475 A | 5/1998 | Bill et al. |
| 5,768,193 A | 6/1998 | Lee et al. |
| 5,777,919 A | 7/1998 | Chi-Yung et al. |
| 5,787,036 A | 7/1998 | Okazawa |
| 5,793,079 A | 8/1998 | Georgescu et al. |
| 5,834,851 A | 11/1998 | Ikeda et al. |
| 5,836,772 A | 11/1998 | Chang et al. |
| 5,841,700 A | 11/1998 | Chang |
| 5,847,441 A | 12/1998 | Cutter et al. |
| 5,862,076 A | 1/1999 | Eitan |
| 5,864,164 A | 1/1999 | Wen |
| 5,870,335 A | 2/1999 | Khan et al. |
| 5,946,558 A | 8/1999 | Hsu |
| 5,949,728 A | 9/1999 | Liu et al. |
| 5,963,412 A | 10/1999 | En |
| 5,963,465 A | 10/1999 | Eitan |
| 5,966,603 A | 10/1999 | Eitan |
| 5,969,993 A | 10/1999 | Takeshima |
| 5,973,373 A | 10/1999 | Krautschneider et al. |
| 5,990,526 A | 11/1999 | Bez et al. |
| 5,991,202 A | 11/1999 | Derhacobian et al. |
| 6,018,186 A | 1/2000 | Hsu |
| 6,020,241 A | 2/2000 | You et al. |
| 6,028,324 A | 2/2000 | Su et al. |
| 6,030,871 A | 2/2000 | Eitan |
| 6,034,403 A | 3/2000 | Wu |
| 6,063,666 A | 5/2000 | Chang et al. |
| 6,108,241 A * | 8/2000 | Chevallier ............. 365/185.33 |
| 6,128,226 A | 10/2000 | Eitan et al. |
| 6,134,156 A | 10/2000 | Eitan |
| 6,137,718 A | 10/2000 | Reisinger |
| 6,157,570 A | 12/2000 | Nachumovsky |
| 6,163,048 A | 12/2000 | Hirose et al. |
| 6,169,691 B1 * | 1/2001 | Passotti et al. ........ 365/185.25 |
| 6,240,032 B1 | 5/2001 | Fukumoto |

OTHER PUBLICATIONS

U.S. patent application Ser. No. 09/082,280, Eitan, filed May 20, 1998.

U.S. patent application Ser. No. 09/348,720, Eitan, filed Jul. 6, 1999.

U.S. patent application Ser. No. 09/413,408, Eitan, filed Oct. 10, 1999.

U.S. patent application Ser. No. 09/536,125, Eitan et al., filed Mar. 28, 2000.

Ricco, Bruno, "Nonvolatile Multilevel Memories for Digital Application," *IEEE*, vol. 86, No. 12, pp. 2399–2421, issued 1998.

"2 Bit/Cell EEPROM Cell Using Band–To–Band Tunneling For Data Read–Out," *IBM Technical Disclosure Bulletin*, U.S. IBM Corp. NY vol. 35, No. 4B, ISSN:0018–8689, Sep., 1992.

Hsing–Huang Tsent et al. "Thin CVD Gate Dielectric for ULSI Technology", *IEEE*, 0–7803–1450–6, 1993.

Pickar, K.A., "Ion Implantation in Silicon," *Applied Solid State Science*, vol. 5, R. Wolfe Edition, Academic Press, New York, 1975.

Bhattacharyya et al., "FET Gate Structure for Nonvolatile N–Channel Read–Mostly Memory Device," *IBM Technical Disclosure Bulletin*, U.S. IBM Corp. vol. 18, No. 6, pp. 1768, 1976.

* cited by examiner

FIG.4

METHOD FOR OPERATION OF AN EEPROM ARRAY, INCLUDING REFRESH THEREOF

CROSS-REFERENCE TO RELATED APPLICATIONS

The present application claims the benefit of U.S. application Ser. No. 09/761,818, filed Jan. 18, 2001, entitled "AN EEPROM ARRAY AND METHOD FOR OPERATION THEREOF", which is incorporated herein by reference.

FIELD OF THE INVENTION

The present invention relates generally to electrically erasable, programmable read only memory (EEPROM) arrays and methods for operation thereof, and more particularly, to refreshing the threshold voltage of bits of cells in such arrays.

BACKGROUND OF THE INVENTION

EEPROM arrays are utilized for storage of data. Typically, the data stored therein can be changed, either by programming or erasing, multiple times over the lifetime of the array. As in all non-volatile memory arrays, each cell is individually programmed; however, in contrast to either erasable, programmable read only memory (EPROM) or FLASH arrays, in EEPROM arrays each cell can also be individually erased.

Typical memory uses a single bit per cell, wherein electrical charge is stored on the floating gate of each cell. Within each cell, two possible voltage levels exist. The levels are controlled by the amount of charge that is stored on the floating gate; if the amount of charge on the floating gate is above a certain reference state, the cell is considered to be in a different state. Accordingly, each cell is characterized by a specific threshold voltage ($V_t$). Programming the cell increases threshold voltage $V_t$, whereas erasing the cell decreases threshold voltage $V_t$.

Non-volatile memory arrays comprise rows and columns of memory cells electrically connected to word lines (rows of the array) and bit lines (columns). Each memory cell is connected to one word line and at least one bit line. Another terminal of the memory cell is connected either to another bit line (in which case, one of the bit lines is called the drain line and the other is the source line), or to a common line, such as a common source ground, depending on the array architecture. Programming or erasing an individual cell requires application of certain voltages to the word line and bit lines.

Generally, when programming or erasing a cell, one or more of the neighboring cells may also be affected by the programming/erasing operation, causing thereto a possible change in their threshold voltage. This unwanted change in threshold voltage of unselected cells is known in the art as the disturb problem, herein a "disturb". A similar effect also occurs during a read operation. However, due to the relative weakness of the applied voltage levels, the effect during read is significantly smaller. A standard prior art solution to the disturb problem in EEPROM arrays is to use two transistors per memory bit of the array, i.e., in addition to the memory transistor, a select transistor is also incorporated per cell. The select transistor usually disconnects the drain of the memory transistors of the unselected word lines from the drain voltages used in the programming/erasing operations. The use of a select transistor per cell, however, significantly increases the area of the memory array.

There are other phenomena that affect the threshold voltage of memory cells. For example, the memory cell has a certain retention of charge that degrades with time, meaning that the programmed state of the cell deteriorates over the course of time. At elevated operating temperatures, this deterioration is further accelerated.

SUMMARY OF THE INVENTION

The present invention seeks to provide a novel technique for combating changes in threshold voltage of memory cells. In accordance with a preferred embodiment of the present invention, the threshold voltage of a memory cell in a programmed state that has been lowered, such as a result of program or erase disturbs or retention problems, is refreshed (that is, re-elevated) to a predetermined level. This is preferably accomplished by monitoring the threshold voltage level of the bit or bits of the cells, comparing with at least one predetermined threshold voltage level, and applying a set of programming voltages that raise the threshold voltage level by the desired amount. In addition, the threshold voltage of a memory cell in an erased cell that has been raised, due to some operation on the array, for example, may be refreshed (i.e., re-lowered) to a predetermined level, such as by applying a set of erasing voltages that lower the threshold voltage by the desired amount.

In general, after performing an operation on bits of a slice of an EEPROM array, the threshold voltages of a portion of or all the bits of the entire slice are monitored and compared with the level prior to the operation. For example, after programming bits of a slice of the EEPROM array, the threshold voltage levels of all of the bits of the entire slice may be monitored and compared with the preceding levels. Generally, after erasing bits of the slice, the threshold voltages of those bits sharing the same bit line as the selected bits that were erased may be monitored. Those bits that need to be refreshed may then be programmed to the desired threshold voltage level.

The refresh voltages may be applied one bit at a time or to more than one bit at a time, until all the bits are refreshed. If desired, the threshold voltage may even be refreshed to a level below or above the original level, by applying a different set of voltages or by changing the duration of the voltage application.

There is thus provided in accordance with a preferred embodiment of the present invention, a method for operating an electrically erasable programmable read only memory (EEPROM) array, the method including refreshing a threshold voltage of a bit of a memory cell in an EEPROM array, the threshold voltage being different than a previous threshold voltage, by restoring the threshold voltage of the bit at least partially back to the previous threshold voltage.

In accordance with a preferred embodiment of the present invention, the method further includes comparing the threshold voltage of said bit with the previous threshold voltage, wherein said refreshing is performed if the threshold voltage of said bit has crossed over a predetermined level.

Further in accordance with a preferred embodiment of the present invention the comparing is performed after a predetermined number of operations performed on the array, or alternatively, after a predetermined amount of time.

Still further in accordance with a preferred embodiment of the present invention, the method includes performing an operation on at least one bit of a selected memory cell of the array, the operation including at least one of programming and erasing, and comparing the threshold voltage of at least one bit of at least one other memory cell in the EEPROM array. If that at least one bit (i.e., the at least one disturbed bit) is supposed to be in a programmed state, then its threshold voltage is re-elevated at least partially to the previous threshold voltage level. If the disturbed bit is supposed to be in an erased state, then its threshold voltage is re-lowered at least partially to the previous threshold voltage level.

Further in accordance with a preferred embodiment of the present invention, the method includes, before performing the operation, recording the threshold voltage of the at least one bit of the at least one other memory cell in the EEPROM array.

Still further in accordance with a preferred embodiment of the present invention the array includes a multiplicity of the memory cells, wherein each memory cell is electrically connected to a word line and to two bit lines, one of the bit lines serving as a source and the other bit line serving as a drain.

In accordance with a preferred embodiment of the present invention, the method further includes placing at least one column of the memory cells between a pair of isolation zones, the isolation zones defining therebetween a slice of word lines and bit lines.

Further in accordance with a preferred embodiment of the present invention the memory cells are NROM memory cells.

Still further in accordance with a preferred embodiment of the present invention the operation on the bit of the selected memory cell of the array is performed while applying an inhibit gate voltage to the word line of an unselected memory cell.

BRIEF DESCRIPTION OF THE DRAWINGS

The present invention will be understood and appreciated more fully from the following detailed description taken in conjunction with the appended drawings in which.

DETAILED DESCRIPTION OF THE PRESENT INVENTION

The present invention is directed to refreshing the threshold voltages of memory cells that have changed. The invention is applicable for any kind of EEPROM array, and refreshes the threshold voltage regardless of the reason for the change in threshold voltage, e.g., program or erase disturbs or retention problems. The invention may also be carried out in conjunction with methods for inhibiting loss in threshold voltage due to program or erase disturbs. Such methods are particularly advantageous for nitride read only memory (NROM) memory cells, and are disclosed in applicant/assignee's co-pending U.S. patent application, entitled "AN EEPROM ARRAY AND METHOD FOR OPERATION THEREOF", the disclosure of which is incorporated herein by reference. Accordingly, even though it is understood that the present invention is not limited to NROM cells, the description follows for an EEPROM array with NROM cells.

Since one aspect of the present invention is monitoring the loss in threshold voltage after program or erase operations, and refreshing the threshold voltage by re-programming the bit or bits of the cell, an explanation of the programming operation and of the program and erase disturbs in an EEPROM array with NROM cells is first presented in order to better understand this aspect of the present invention.

Figure 1:
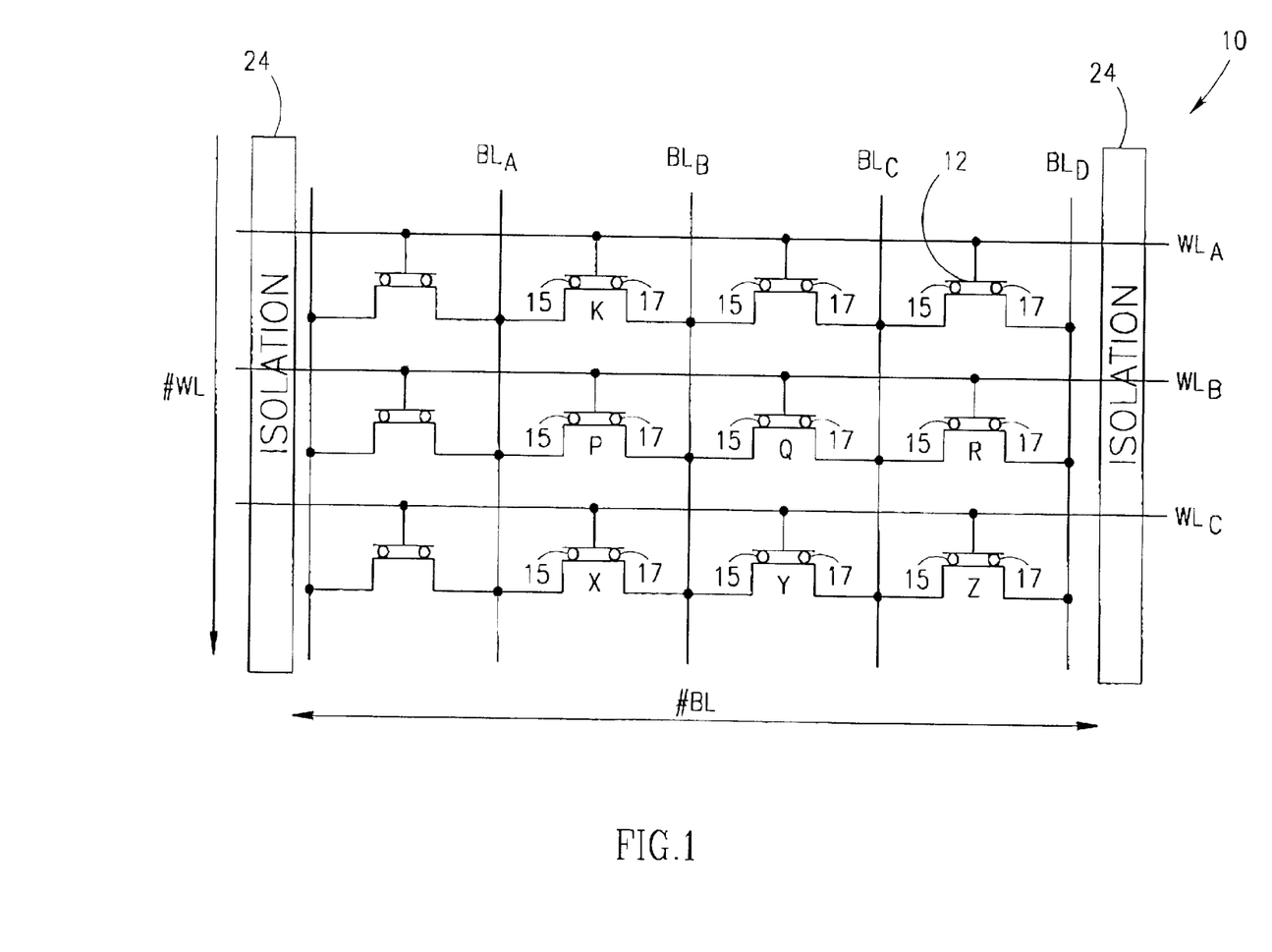
FIG. 1 is a schematic illustration of an EEPROM array of NROM memory cells, constructed and operative in accordance with a preferred embodiment of the present invention.

Reference is now made to FIG. 1, which illustrates an EEPROM array 10 constructed and operative in accordance with a preferred embodiment of the present invention. Array 10 comprises a multiplicity of memory cells 12 each connected to an associated word line, generally designated WL, and two bit lines, generally designated BL. For purposes of the following explanation, memory cells 12 are labeled K, P, Q, R, X, Y and Z, respectively. In FIG. 1, memory cells P, Q and R, share the same word line $WL_B$. Cells K, P, X, Q and Y share the same bit line $BL_B$. Cell Z is connected to word line $WL_C$ and bit lines $BL_C$ and $BL_D$.

In accordance with a preferred embodiment of the present invention, memory cells 12 are nitride read only memory (NROM) cells. NROM cells are described in various publications, such as U.S. Pat. Nos. 6,552,387 and 6,011,725, assigned to the common assignee of the present invention, the disclosure of which is incorporated herein by reference. U.S. Pat. Nos. 6,552,387 and 6,011,725 describe, inter alia, the steps of programming, reading and erasing NROM cells. NROM cells have not heretofore been used in EEPROM arrays. The present invention enables individually accessing NROM cells in such an EEPROM array, and inhibiting program and erase disturbs in the array.

If it is desired to program right-side bit 17, then the bit line closest to right-side bit 17 (e.g., $BL_B$ for cell P) is the drain and the bit line on the other side (e.g., $BL_A$ for cell P) is the source. When programming right-side bit 17, channel hot electrons are used to inject electrons in a lumped pocket close to the drain side of the cell. The electrons are located in localized states in the nitride layer. In order to program left-side bit 15 of the cell, one simply reverses the role of drain and source during programming.

The explanation follows with reference to a two-bit NROM cell. However, it is readily appreciated by those skilled in the art, that the invention is applicable for single and multi-bit cells as well.

If it is desired to program right-side bit 17 of memory cell P, a gate voltage $V_g$ (typically in the range of approximately 7–10V, e.g., 9V) is applied to word line $WL_B$, a drain voltage $V_d$ (typically in the range of approximately 4–5V, e.g. 4.5V) is applied to bit line $BL_B$, and bit line $BL_A$ is grounded (0V). All other bit lines are preferably floated near ground prior to any operation (programming or erasing). All other word lines are grounded. The right-side bits 17 of unselected cells K and X, and left-side bit 15 of cell Y share the same bit line $BL_B$ as cell P, and also receive drain voltage $V_d$. Since the gate voltage of cells K, X and Y is zero, these bits experience a lowering of the threshold voltage. In other words, as a consequence of programming right-side bit 17 of cell P, right-side bits 17 of unselected cells K and X, and left-side bit 15 of cell Y undergo partial erasure.

Unselected cell Z does not share the same bit line $BL_B$ or the same word line $WL_B$ as cell P. However, the application of the positive gate voltage to word line $WL_B$ causes some current flow towards the right side of array 10, until the bit lines towards the right of bit line $BL_B$ attain a drain voltage close to $V_d$. (This phenomenon is herein referred to as "high voltage propagation".) The result is that both bits of unselected cell Z receive a zero gate voltage and a positive drain voltage, thereby lowering their threshold voltage. In other words, as a consequence of programming right-side bit 17 of cell P, both the left-side and right-side bits 15 and 17 of cell Z undergo partial erasure. The same holds true for right-side bit 17 of cell Y, as well as other similarly positioned bits in EEPROM array 10.

Fortunately, however, the duration of programming is typically in the range of approximately 1–10 μsec. Since this programming time is relatively short, the right-side bits 17 of cells K and X, and both bits of cells Y and Z are only slightly erased for each programming operation on cell P. The fact that the gate voltage of cells K, X, Y and Z is only zero and not negative, also minimizes the extent of erasure of these bits.

In order to contain and control the voltage propagation due to the application of the programming voltage, memory cells 12 are preferably placed between a pair of isolation zones 24. The isolation zones 24 define therebetween a slice of word lines and bit lines. There is no voltage propagation past isolation zones 24. Depending on the array design and voltages used, the isolation zones 24 can divide the array into slices of just one column or a plurality of columns.

Unselected cells Q and R share the same word line $WL_B$ as cell P, and also receive the positive gate voltage $V_g$. Therefore, there is virtually no effect on the threshold voltages of both bits of cells Q and R, since the bit lines on either side of cells Q and R are relatively high.

All the bit lines to the left of bit line $BL_A$ are floated near ground, and thus there is virtually no effect on the threshold voltage of the bits of cells on those bit lines.

Table A summarizes the disturb on unselected cells due to programming right-side bit 17 of cell P:

TABLE A

| Cell | Bit | $V_g$ | $V_d$ | $V_s$ | Effect on $V_t$ |
|------|-------|-----|-----|-----|----------------|
| P | Right | 9 | 4.5 | 0 | Program |
| K | Right | 0 | 4.5 | 0 | Partial Erase |
| Q | Left | 9 | 4.5 | 4.5 | Virtually None |
| Q | Right | 9 | 4.5 | 4.5 | Virtually None |
| R | Both | 9 | 4.5 | 4.5 | Virtually None |
| X | Right | 0 | 4.5 | 0 | Partial Erase |
| Y | Left | 0 | 4.5 | 4.5 | Partial Erase |
| Y | Right | 0 | 4.5 | 4.5 | Partial Erase |
| Z | Both | 0 | 4.5 | 4.5 | Partial Erase |

If it is desired to erase right-side bit 17 of memory cell P, a negative gate voltage $V_g$ (such as approximately in the range of −5 to −7V) is applied to word line $WL_B$, a positive drain voltage $V_d$ (typically in the range of approximately 3–5V, e.g. 4V) is applied to bit line $BL_B$, and bit line $BL_A$ is floating. Left-side bit 15 of cell Q receives the exact same gate, drain and source voltages. This means that left-side bit 15 of cell Q is also erased together with right-side bit 17 of cell P. Accordingly, after an erasure of right-side bit 17 of cell P, left-side bit 15 of cell Q must be re-programmed to its original value. This is the case for a two-bit NROM cell. For single bit operation, it is preferable to arrange the bits so that they do not share a common bit line. In such an arrangement, no neighboring bit would be erased upon erasure of right-side bit 17 of cell P, for example.

Right-side bit 17 of cell Q and both bits of cell R share the same word line $WL_B$ as cell P, and also receive the negative gate voltage $V_g$. Since there is only a negative gate voltage applied to word line $WL_B$ and the other word lines are grounded, and the bit lines on either side of cells Q and R are floated near ground prior to erasure of right-side bit 17 of cell P, there is no voltage propagation to the other cells and there is negligible erasure of right-side bit 17 of cell Q and both bits of cell R.

The right-side bits 17 of unselected cells K and X, and left-side bit 15 of cell Y share the same bit line $BL_B$ as cell P, and also receive drain voltage $V_d$. Since the gate voltage of cells K, X and Y is zero, right-side bits 17 of unselected cells K and X, and left-side bit 15 of cell Y experience a lowering of the threshold voltage. In other words, as a consequence of erasing cell P, right-side bits 17 of cells K and X, and left-side bit 15 of cell Y undergo partial erasure. Unfortunately, the duration of erasing is typically in the range of approximately 10 μsec −10 msec. After many cycles, the accumulated erasure of the unselected cells may be intolerably significant.

Unselected cell Z does not share the same bit line $BL_B$ or the same word line $WL_B$ as cell P, and there is virtually no effect on its threshold voltage. The same holds true for right-side bit 17 of cell Y.

Table B summarizes the disturb effects on unselected cells due to erasing right-side bit 17 of cell P:

TABLE B

| Cell | Bit | $V_g$ | $V_d$ | $V_s$ | Effect on $V_t$ |
|------|-------|-----|-------|-------|----------------|
| P | Right | −7 | 4 | Float | Erase |
| K | Right | 0 | 4 | Float | Partial Erase |
| Q | Left | −7 | 4 | Float | Erase |
| Q | Right | −7 | Float | Float | Virtually None |
| R | Both | −7 | Float | Float | Virtually None |
| X | Right | 0 | 4 | Float | Partial Erase |
| Y | Left | 0 | 4 | Float | Partial Erase |
| Y | Right | 0 | Float | Float | Virtually None |
| Z | Both | 0 | Float | Float | Virtually None |

From Tables A and B and the foregoing discussion, it is seen that after many operating cycles, the accumulated disturb to the unselected cells may significantly lower the threshold voltages of bits of the unselected cells that have been at a programmed state. The threshold voltages may be refreshed as is now described in detail.

Figure 2:
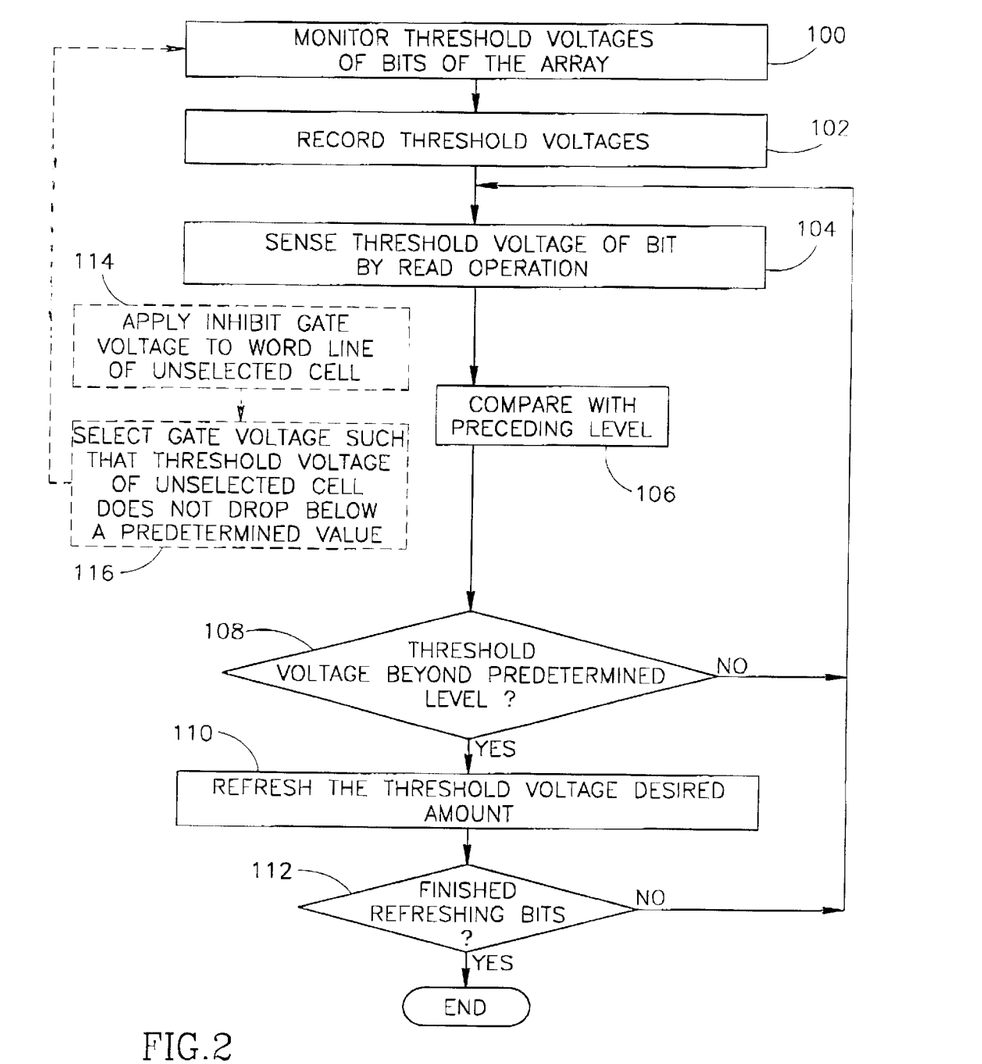
FIG. 2 is a flow chart of a method for refreshing a threshold voltage of a bit of a memory cell in an EEPROM array, in accordance with a preferred embodiment of the present invention.
Figure 3:
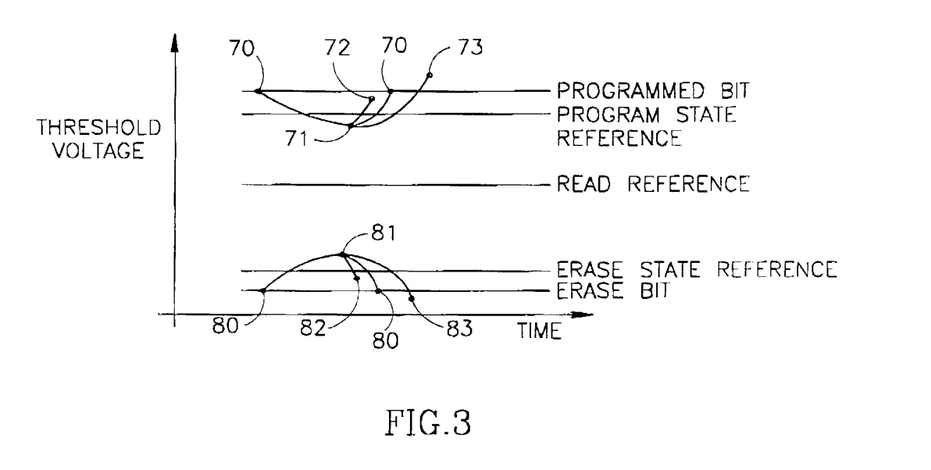
FIG. 3 is a simplified graph of the threshold voltage level of a bit in a programmed state and of a bit in an erased state, before and after refreshing their threshold voltages, in accordance with a preferred embodiment of the present invention.

Reference is now made to FIG. 2 which illustrates refreshing threshold voltages, in accordance with a preferred embodiment of the present invention, and to FIG. 3 which illustrates the threshold voltage level of a bit in a programmed state and of a bit in an erased state, before and after refreshing their threshold voltage. After performing an operation on the memory cells of the array, the threshold voltage of at least one bit of the array is monitored, such as by a sense amplifier, while reading the bit against a READ REFERENCE (step 100, FIG. 2).

Referring to FIG. 3, if the threshold voltage of a bit is more positive than a READ REFERENCE voltage level, then that bit is considered to be in a programmed state. It may be desired or necessary that the threshold voltage of a programmed bit be maintained equal to or greater than a predetermined threshold voltage level, referred to as a PROGRAM STATE REFERENCE voltage level. When monitoring the threshold voltages of bits of the array in step 100 (FIG. 2), the threshold voltage of one of the programmed bits may, for example, be at a voltage level referred to as a PROGRAMMED BIT voltage level, such as indicated at reference numeral 70, which may be greater than the PROGRAM STATE REFERENCE voltage level.

Conversely, if the threshold voltage of a bit is lower than the READ REFERENCE voltage level, then that bit is considered to be in an erased state. It may be desired or necessary that the threshold voltage of an erased bit be maintained equal to or less than a predetermined threshold voltage level, referred to as an ERASE STATE REFERENCE voltage level. When monitoring the threshold voltages of bits of the array in step 100 (FIG. 2), the threshold voltage of one of the erased bits may, for example, be at a voltage level referred to as an ERASED BIT voltage level, such as indicated at reference numeral 80, which may be less than the ERASE STATE REFERENCE voltage level.

In accordance with one embodiment of the invention, the threshold voltages of the bits that have been monitored or the results of the read operation (step 100) may be recorded, such as in the memory of a processing unit (step 102). The threshold voltages or the results of the read operations (step 100) may be recorded for all the bits in the array or only some of the bits of the array, such as the bits in one or more slices of the array, depending on the array architecture. Afterwards, the threshold voltages of the bits may again be sensed by a read operation against the PROGRAM STATE REFERENCE (step 104) and compared with the preceding levels that have been previously recorded (step 106).

FIG. 3 illustrates examples of sensing the threshold voltage of a bit and comparing the present threshold voltage level with the previous level as in steps 100, 104 and 106. For example, the threshold voltage of a bit may have been sensed (step 100) at the PROGRAMMED BIT level 70, which is above the READ REFERENCE level. As a result of this read operation, the bit is expected to be a programmed bit. A second read operation, performed sometime thereafter, may verify that the bit is still above the PROGRAM STATE REFERENCE level. However, this may not always be the case. After many operations on the array or after some time the same bit threshold voltage level may have dropped below the PROGRAM STATE REFERENCE level, to a level indicated at reference numeral 71. In this case, the threshold voltage of the bit has crossed over a predetermined level, i.e., the PROGRAM STATE REFERENCE level, or in other words is now beyond the predetermined level.

Conversely, the threshold voltage of a bit may have been sensed (step 100) at the ERASED BIT level 80, which is below the ERASE STATE REFERENCE level. As a result of this read operation, the bit is expected to be an erased bit. A second read operation, performed sometime thereafter, may verify that the bit is still below the ERASE STATE REFERENCE level. However, this may not always be the case. After many operations on the array or after some time the same bit threshold voltage level may have drifted above the ERASE STATE REFERENCE level, to a level indicated at reference numeral 81. In this case, the threshold voltage of the bit has crossed over a predetermined level, i.e., the ERASE STATE REFERENCE level, or in other words is now beyond the predetermined level. Recording (step 102) and comparing (step 106) are optional steps in the method of the invention. In any case, after sensing the threshold voltage of the bit (step 104), if it has been determined that the threshold voltage of the bit has crossed over the predetermined level (step 108), then the threshold voltage of that bit is refreshed, i.e., restored, to some predefined level (step 110). For example, the threshold voltage level may be refreshed substantially to the previously sensed level. Referring to FIG. 3, this means that the programmed bit is refreshed to the programmed state 70 and the erased bit is refreshed to the erased state 80.

Alternatively, the threshold voltage may be partially refreshed to a level that is not as much as the previous level. For example, referring to FIG. 3, the programmed bit may be refreshed to a programmed state 72, which is below the programmed state 70. Conversely, the erased bit may be refreshed to an erased state 82, which is greater than (i.e., less erased than) the erased state 80.

Still alternatively, the threshold voltage may be over-refreshed to a level more than the previous level. For example, referring to FIG. 3, the programmed bit may be refreshed to a programmed state 73, which is above the programmed state 70. Conversely, the erased bit may be refreshed to an erased state 83, which is less than (i.e., more erased than) the erased state 80.

In order to check that the threshold voltage has been refreshed, the bit is read against a REFERENCE that is at or beyond the PROGRAM or ERASE STATE REFERENCE, for programmed and erased bits, respectively. The process continues until all bits have been refreshed (step 112). As mentioned previously, the bits may be refreshed serially one at a time, or may be refreshed in parallel, more than one at a time.

Alternatively to the sensing steps 100 and 104 in FIG. 2, parallel sensing may also be used against more than one reference, e.g. parallel sensing against the READ REFERENCE and the PROGRAM STATE REFERENCE.

Figure 4:
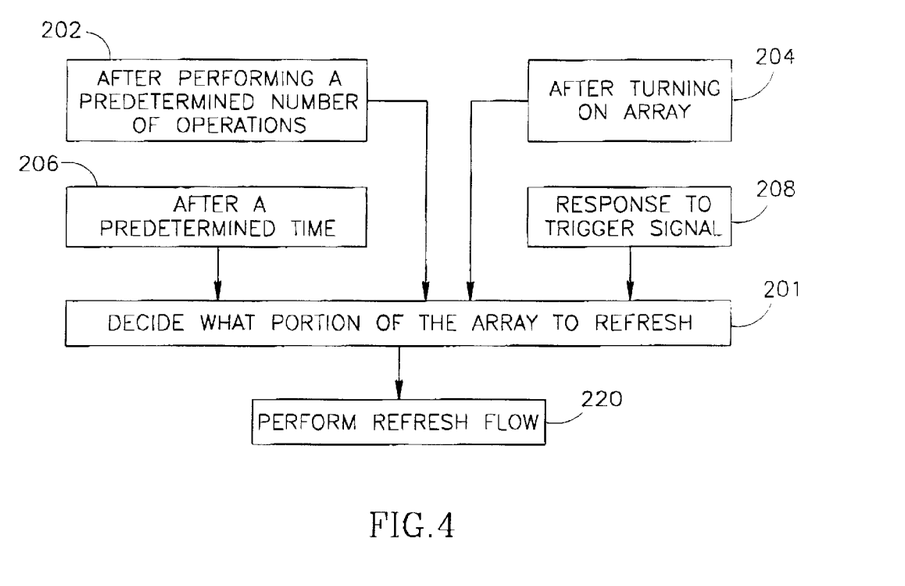
FIG. 4 is a flow chart of a method for refreshing a threshold voltage of a bit of a memory cell in an EEPROM array, in accordance with a preferred embodiment of the present invention, indicating different possible criteria for deciding to refresh the threshold voltage.

Referring to FIG. 4, the memory cells refresh flow (step 220), comprising at least steps 104, 108 and 110 as described above and shown in FIG. 2, may be performed after deciding what portion of the array to refresh (step 201) at one or more of the following states:

1. After performing a predetermined number of operations (i.e., one or more) on any of the bits of the array (step 202). The operation may include programming or erasing.
2. When the array is turned on (step 204).
3. After a predetermined time (step 206), i.e., periodically, even if no operation has been performed.
4. As a response to a trigger signal, e.g. coming from an external controller unit (step 208).

The portion of the array that is monitored and refreshed may depend on the event that caused the refresh flow to start and on the array architecture, or may be determined by an external or internal controlling unit. For example, in a virtual ground slice, a program operation performed on one bit may cause program disturb on all the bits on the same word line and erase disturbs on the bits on different word lines. Thus, it may be desired to monitor and refresh, if necessary, all the bits in that slice. In a different case, in which a refresh operation is performed in response to an external trigger signal, the array portion to be monitored and refreshed may be determined by the external controlling unit that, for example, tracks the operation history of the array.

The refresh process is particularly advantageous for detecting and refreshing any threshold voltage drift (e.g. the threshold voltage of programmed bits that have been lowered due to retention loss), even if no disturbs were applied to those bits. As a result, the quality and reliability of those bits are improved since their original states are restored.

The following is an illustrative example, but it is appreciated that the scope of the invention is not limited to these exemplary values. In the array shown in FIG. 1, an operation, such as erasing the right-side bit 17 of cell P is performed. As seen above in Table B, the right-side bit 17 of cells X and K undergo partial erasure due to erasing the right-side bit 17 of cell P. Following this erase operation, the right-side bit 17 of cell X is read (as in step 100 above), and recorded (as in step 102 above). In general, the result of this read operation is recorded as a logic state. For example, a logic '0' may be recorded if the result of this read operation indicates that the threshold voltage of the right-side bit 17 of cell X is higher than a READ REFERENCE level. In such a case, the bit is expected to be in a programmed state. Next, the bit is read again, but now against a PROGRAM STATE REFERENCE (as in step 104 above). If the right-side bit 17 of cell X was programmed recently and did not experience many program/erase cycles of neighboring bits, then it is expected that its threshold voltage has negligibly lowered. However, if the right-side bit 17 of cell X was programmed long ago, or if it experienced many program/erase cycles of neighboring bits, then the result of the second read operation may indicate that the threshold voltage of the bit is below the PROGRAM STATE REFERENCE level. In such case the right-side bit 17 of cell X may be refreshed (i.e. re-programmed in order to elevate its threshold voltage).

Any suitable programming algorithm may be used to program the bit, such as a step programming algorithm disclosed in U.S. Pat. No. 6,396,741 assigned to the common assignee of the present invention, the disclosure of which is incorporated herein by reference. The refresh flow may now be repeated to verify if the right-side bit 17 of cells on the same bit line (e.g. that of cell K) should be refreshed.

The following is another example of an embodiment of the present invention. As seen hereinabove with reference to Table A, programming the right-side bit 17 of cell P causes a disturb in cells located on word lines different from the word line of cell P. In other words, programming the right-side bit 17 of cell P disturbs bits in cells X, Y and Z, in cell K and in the cells to the right of cell K. Accordingly, in general, after programming bits of the slice of array 10, the threshold voltages of all of the bits of the entire slice may be monitored. The threshold voltages of bits that are in a programmed state may be compared to the PROGRAM STATE REFERENCE level. It is appreciated that the location of the bit where the operation was performed (e.g. right side bit 17 of cell P in this example) may be used to reduce the array portion that should be monitored and probably refreshed. In this example, when programming the right side bit 17 of cell P, the positive voltage of $BL_B$ is propagated to all the other bit lines at its right. However, since $BL_A$ is grounded, all the bit lines at the left of $BL_B$ are at a close-to-ground potential. Therefore, in this example, by knowing the location of the bit that was programmed it is possible to omit the refresh flow from all the bits at the left of $BL_B$. It is further appreciated that any knowledge on the state of the disturbed bits may also be used to reduce the array portion that should be monitored and probably refreshed. In this example, since the disturb causes erase on the bits of unselected word lines, any erased bit may be omitted from the refresh flow.

The refresh programming voltages may be applied one bit at a time or to more than one bit at a time, until all the bits are refreshed (as in step 112 above).

It is appreciated that, if desired, the threshold voltage may be refreshed to a level below or even above the original level, by applying a different set of voltages or by changing the duration of the voltage application or by verifying the final programming level using a different reference level than the PROGRAM STATE REFERENCE or ERASE STATE REFERENCE levels.

In order to help understand the invention, Table C summarizes an oversimplified, degenerate case of the invention, wherein only the right-side bit of cell P has been programmed, and afterwards the affected bits are refreshed.

TABLE C

| Cell | Bit | $V_g$ | $V_d$ | $V_s$ | Effect on $V_t$ after 100,000 cycles on neighboring cells | $V_g$ | $V_d$ | $V_s$ | Refresh Voltage (applied one at a time) | State of $V_t$ after refresh |
|---|---|---|---|---|---|---|---|---|---|---|
| P | Right | 9 | 4.5 | 0 | Programmed | 0 | 0 | 0 | | Program |
| K | Right | 0 | 4.5 | 0 | −100 mV | 9 | 4.5 | 0 | | ~Original value |
| Q | Left | 9 | 4.5 | 4 | Virtually None | 0 | 0 | 0 | | ~Original value |
| Q | Right | 9 | 4 | 4 | Virtually None | 0 | 0 | 0 | | ~Original value |
| R | Both | 9 | 4 | 4 | Virtually None | 0 | 0 | 0 | | ~Original value |
| X | Right | 0 | 4.5 | 0 | −100 mV | 9 | 4.5 | 0 | | ~Original value |
| Y | Left | 0 | 4.5 | 4 | −100 mV | 9 | 4.5 | 0 | | ~Original value |
| Y | Right | 0 | 4 | 4 | −100 mV | 9 | 4.5 | 0 | | ~Original value |
| Z | Both | 0 | 4 | 4 | −100 mV | 9 | 4.5 | 0 | | ~Original value |

Refreshing an individual bit may slightly disturb other cells, as described hereinabove. However, the disturb effect for a single refresh operation is negligible compared to the accumulated disturb after many operating cycles. Of course, one does not need to wait to refresh after 100,000 cycles. Rather, threshold voltages may be refreshed after several hundred or thousand cycles, and the refresh rate may be optimized to suit the application.

As mentioned hereinabove, the present invention may also be advantageously carried out in conjunction with methods for inhibiting loss in threshold voltage due to program or erase disturbs, which methods are disclosed in applicant/assignee's co-pending U.S. patent application, entitled "AN EEPROM ARRAY AND METHOD FOR OPERATION THEREOF". This option is shown in dotted lines in FIG. 2. In accordance with a preferred embodiment of the present invention, an unselected memory cell that can experience a possible drop in threshold voltage is inhibited from being erased by application of an inhibit gate voltage to the word line of the unselected cell (step 114). The term "inhibiting" as used throughout the specification and claims refers to reducing, minimizing or even eliminating the disturb effect.

The magnitude of the gate voltage is selected such that the difference between the drain or source and gate voltages applied to the unselected cell is sufficiently small so that the threshold voltage of the unselected cell does not drop below a predetermined value (step 116). By application of the inhibit voltage, it is possible to significantly increase the number of operations performed on bits of the array before having to refresh their threshold voltages.

The selection of the portion of the array to be refreshed may be affected when inhibiting voltages are used. In the first example described above, in which the right side bit 17 of cell P was erased, and assuming that no inhibit voltages are applied to the unselected word lines ($WL_A$ and $WL_C$ in FIG. 2), then the refresh flow should be applied to at least all the bits on $BL_B$. Refreshing additional bits (e.g. all the bits in the slice) is optional. However, if inhibit voltages are applied to the unselected word lines ($WL_A$ and $WL_C$ in FIG. 2), then the refresh flow may be applied to all the bits in the slice.

It will be appreciated by persons skilled in the art that the present invention is not limited by what has been particularly shown and described herein above. Rather the scope of the invention is defined by the claims that follow:

What is claimed is:

1. A method for operating a non-volatile memory array, the method comprising:

performing an operation on a first bit of a first memory cell within said array;

correlating each operation performed on said first bit with a set of cells in proximity with said first cell whose threshold voltages may have been disrupted by the operation on said first bit; and refreshing a threshold voltage of a second bit of a second memory cell which is within said set of cells and whose threshold voltage has changed from a previous threshold voltage, by restoring the threshold voltage of said second bit at least partially back to the previous threshold voltage.

2. The method according to claim 1 wherein said refreshing is performed if the threshold voltage of said second bit has crossed over a predetermined level.

3. The method according to claim 2 wherein said refreshing is performed after a predetermined number of operations performed on said array.

4. The method according to claim 2 wherein said refreshing is performed periodically.

5. The method according to claim 2 and further comprising, before said refreshing, performing an operation on at least one bit of a selected memory cell of said array, said operation comprising at least one of programming and erasing.

6. The method according to claim 5 wherein said refreshing comprises restoring the threshold voltage generally to the threshold voltage prior to performing said operation on said bit of said selected memory cell.

7. The method according to claim 5 wherein said refreshing comprises partially restoring the threshold voltage to a level lower than the threshold voltage prior to performing said operation on said bit of said selected memory cell.

8. The method according to claim 5 wherein said refreshing comprises over-restoring the threshold voltage to a level greater than the threshold voltage prior to performing said operation on said bit of said selected memory cell.

9. The method according to claim 5 and further comprising, before performing the operation, recording the threshold voltage of said at least one bit of said at least one other memory cell in said EEPROM array.

10. The method according to claim 9 and further comprising comparing the threshold voltage of said bit after performing the operation with the threshold voltage before performing the operation.

11. The method according to claim 1 wherein said array comprises a multiplicity of said memory cells, each memory cell being connected to a word line and to at least one bit line, and the method further comprises placing at least one column of said memory cells between a pair of isolation zones, said isolation zones defining therebetween a slice of word lines and bit lines.

12. The method according to claim 11 wherein said refreshing comprises refreshing the threshold voltage of at least one bit in said slice to a predetermined level.

13. The method according to claim 1 wherein said memory cells are NROM memory cells.

14. The method according to claim 1 wherein said refreshing comprises refreshing the threshold voltage of a bit that has previously been in a programmed state.

15. The method according to claim 1 wherein said refreshing comprises refreshing the threshold voltage of a bit that has previously been in an erased state.

16. The method according to claim 5 wherein said operation on said bit of the selected memory cell of said array is performed while applying an inhibit gate voltage to the word line of an unselected memory cell.

17. The method according to claim 2 wherein said refreshing is performed in response to a trigger signal.

18. The method according to claim 2 wherein said refreshing is performed after turning on said array.

19. In a non-volatile memory array having a plurality of memory cells, the method comprising:

performing an operation on a first bit of a first memory cell within said array; correlating each operation performed on said first bit with a set of cells in proximity with said first cell whose threshold voltages may have been disrupted by the operation on said first bit; and refreshing a threshold voltage of a second bit of a second memory cell which is within said set of cells and whose threshold voltage has changed from a previous threshold voltage, by restoring the threshold voltage of said second bit at least partially back to the previous threshold voltage.

20. The array according to claim 19 wherein said refreshing is performed if the threshold voltage of said second bit has crossed over a predetermined level.

21. The ray according to claim 20 wherein said refreshing is performed alter a predetermined number of operations performed on said array.

22. The array according to claim 20 wherein said refreshing is performed periodically.

23. The array according to claim 20 and further comprising, before said refreshing, performing an operation on at least one bit of a selected memory cell of said array, said operation comprising at least one of programming and erasing.

24. The array according to claim 23 wherein said refreshing comprises restoring the threshold voltage generally to the threshold voltage prior to performing said operation on said bit of said selected memory cell.

25. The array according to claim 23 wherein said refreshing comprises partially restoring the threshold voltage to a level lower than the threshold voltage prior to performing said operation on said bit of said selected memory cell.

26. The array according to claim 23 wherein said refreshing comprises over-restoring the threshold voltage to a level greater than the threshold voltage prior to performing said operation on said bit of said selected memory cell.

27. The array according to claim 23 and further comprising, before performing the operation, recording the threshold voltage of said at least one bit of said at least one other memory cell in said EEPROM array.

28. The array according to claim 27 and farther comprising comparing the threshold voltage of said bit after performing the operation with the threshold voltage before performing the operation.

29. The array according to claim 19 wherein said array comprises a multiplicity of said memory cells, each memory cell being connected to a word line and to at least one bit line, and the array further comprises placing at least one column of said memory cells between a pair of isolation zones, said isolation zones defining therebetween a slice of word lines and bit lines.

30. The array according to claim 29 wherein said refreshing comprises refreshing the threshold voltage of at least one bit in said slice to a predetermined level.

31. The array according to claim 19 wherein said memory cells are NROM memory cells.

32. The array according to claim 19 wherein said refreshing comprises refreshing the threshold voltage of a bit that has previously been in a programmed state.

33. The array according to claim 19 wherein said refreshing comprises refreshing the threshold voltage of a bit that has previously been in an erased state.

34. The array according to claim 23 wherein said operation on said bit of the selected memory cell of said array is performed while applying an inhibit gate voltage to the word line of an unselected memory cell.

35. The array according to claim 20 wherein said refreshing is preformed in response to a trigger signal.

36. The array according to claim 20 wherein said refreshing is performed after turning on said array.

* * * * *